US007567431B2

(12) United States Patent
Brooks, Jr. et al.

(10) Patent No.: US 7,567,431 B2
(45) Date of Patent: Jul. 28, 2009

(54) MAILING MACHINE WITH A REPOSITIONABLE USER CONTROLLER

(75) Inventors: David H. Brooks, Jr., Wilton, CT (US); Ania Mastriano, North Haven, CT (US); Howard M. Stevens, Stratford, CT (US); Kenneth A. Schulz, Bethel, CT (US)

(73) Assignee: Pitney Bowes Inc., Stamford, CT (US)

( * ) Notice: Subject to any disclaimer, the term of this patent is extended or adjusted under 35 U.S.C. 154(b) by 1297 days.

(21) Appl. No.: 10/674,775

(22) Filed: Sep. 30, 2003

(65) Prior Publication Data

US 2005/0071290 A1 Mar. 31, 2005

(51) Int. Cl.
*H05K 7/00* (2006.01)
*H05K 5/00* (2006.01)

(52) U.S. Cl. ........................... 361/679.06; 361/679.29; 361/679.44; 361/679.02; 361/679.04; 361/730; 235/462.43; 439/162; 705/401

(58) Field of Classification Search ............ 705/60–62, 705/401–411; 361/142, 600, 679, 681, 686, 361/724–728, 730–733, 736, 740, 741, 753, 361/755, 756, 759; 235/462.43; 439/162–176; D14/388–394, 432–437

See application file for complete search history.

(56) References Cited

U.S. PATENT DOCUMENTS

| | | | | |
|---|---|---|---|---|
| 5,111,362 | A * | 5/1992 | Flamm et al. | 361/736 |
| 6,013,878 | A * | 1/2000 | Schwartz et al. | 177/25.13 |
| 6,116,560 | A * | 9/2000 | Kim | 248/371 |
| 6,135,411 | A * | 10/2000 | Shirasawa | 248/349.1 |
| 6,477,512 | B1 * | 11/2002 | Beckstrom et al. | 705/60 |
| 6,606,226 | B2 * | 8/2003 | Bass et al. | 361/42 |
| 2004/0043650 | A1 * | 3/2004 | Yang et al. | 439/165 |

* cited by examiner

*Primary Examiner*—John W Hayes
*Assistant Examiner*—Daniel P Vetter
(74) *Attorney, Agent, or Firm*—Brian A. Lemm; Angelo N. Chaclas

(57) ABSTRACT

A mailing machine is provided with a removable control panel device that is repositionable thereby enabling the operator to position the control panel device to face in different directions with respect to the mailing machine. The repositioning of the control panel device allows an operator to clearly view a display on the device from any work area of the mailing machine. For example, if an operator is standing near an input end of the mailing machine, the control panel device can be rotated such that it can be viewed by the operator while standing near the input end of the mailing machine.

17 Claims, 9 Drawing Sheets

MAILING MACHINE WITH A REPOSITIONABLE USER CONTROLLER

FIELD OF THE INVENTION

The invention disclosed herein relates generally to mailing systems, and more particularly to a mailing machine that includes a repositionable user controller.

BACKGROUND OF THE INVENTION

Mailing systems, such as, for example, a mailing machine, often include different modules that automate the processes of producing articles, such as, for example, mail pieces. Mail pieces can include, for example, envelopes, post cards, flats, and the like. The typical mailing machine includes a variety of different modules or sub-systems each of which performs a different task on the mail piece. The mail piece is conveyed downstream utilizing a transport mechanism, such as rollers or a belt, to each of the modules. Such modules could include, for example, a separating module, i.e., separating a stack of mail pieces such that the mail pieces are conveyed one at a time along the transport path, a moistening/sealing module, i.e., wetting and closing the glued flap of an envelope, a weighing module, and a metering/printing module, i.e., applying evidence of postage to the mail piece. The exact configuration of the mailing machine is, of course, particular to the needs of the user.

A control panel device, hereinafter referred to as a User Interface Controller (UIC), performs user interface and controller functions for the mailing machine. Specifically, the UIC provides all user interfaces, executes control of the mailing machine and print operations, calculates postage for debit based upon rate tables, provides the conduit for a Postal Security Device (PSD) to transfer postage indicia to the printer, operates with peripherals for accounting, printing and weighing, and conducts communications with a data center for postage funds refill, software download, rates download, and market-oriented data capture. The UIC, in conjunction with an embedded PSD, constitutes the system meter that satisfies U.S. information-based indicia postage (IBIP) meter requirements and other international postal regulations regarding closed system meters.

In many instances, it is desirable to have the UIC be removable from the mailing machine. For example, since the UIC stores postage value, i.e., monetary value, therein, a user may wish to secure the UIC during times that the UIC will not be used, such as, for example, during lunch or overnight, to prevent unauthorized use of the postage value stored therein. Accordingly, it is desirable for a user to be able to remove the UIC from the mailing machine for secure storage, such as, for example, in a locked cabinet or office, for any time periods during which use of the mailing machine and UIC are not authorized. By removing and securing the UIC, the postage value stored therein will also be secure. When use of the mailing machine and UIC is authorized, the UIC can be replaced on the mailing machine. As another example, in many situations the UIC must be coupled to a network to perform specific activities, including, for example, refilling of postage, remote inspection, downloading of rate information, etc. In many cases, however, a dedicated network connection, such as, for example, an analog telephone line or local area network connection may not be available. Accordingly, it is desirable for a user to be able to remove the UIC from the mailing machine and transport just the UIC to a location where such a connection is available. This allows the mailing machine to be located anywhere within an office, without having a network connection nearby.

FIG. 1 illustrates a conventional mailing machine. Mailing machine 10 comprises a base unit, designated generally by the reference numeral 12, the base unit 12 having a mail piece input end, designated generally by the reference numeral 14 and a mail piece output end, designated generally by the reference numeral 16. A UIC 18 is fixedly mounted on the base unit 12, and includes one or more input/output devices, such as, for example, a keyboard 20 and a display device 22. One or more cover members 24 are pivotally mounted on the base 12 so as to move from the closed position shown in FIG. 1 to an open position (not shown) so as to expose various operating components and parts for service and/or repair as needed.

The base unit 12 further includes a horizontal feed deck 30 which extends substantially from the input end 14 to the output end 16. A plurality of nudger rollers 32 are suitably mounted under the feed deck 30 and project upwardly through openings in the feed deck so that the periphery of the rollers 32 is slightly above the upper surface of the feed deck 30 and can exert a forward feeding force on a succession of mail pieces placed in the input end 14. A vertical wall 34 defines a mail piece stacking location from which the mail pieces are fed by the nudger rollers 32 along the feed deck 30 and into a transport system (not shown) that transports the mail pieces in a downstream path of travel, as indicated by arrow A, through one or more modules, such as, for example, a separator module and moistening/sealing module. Each of these modules is located generally in the area indicated by reference numeral 36. The mail pieces are then passed to a metering/printing module located generally in the area indicated by reference numeral 38, and exit the mailing machine 10 at the output end 16.

There are problems, however, with conventional mailing machines as illustrated in FIG. 1. For example, the UIC 18, and associated input/output devices are typically fixed and non-adjustable. The UIC 18 is oriented in a fixed position, typically such that it faces out from the mailing machine 10 perpendicular to the path of travel A and axis of the mailing machine 10, thereby allowing the operator to access the UIC 18 when standing directly in front of the mailing machine 10. This presents problems to the user of the mailing machine 10 to be able to see the output device, such as a display 22, from all locations around the mailing machine 10. The use of display technology, such as, for example, liquid crystal displays (LCD), which reduce both the end user cost and energy consumption, further compounds this problem as the field of view is significantly reduced when viewing the display from an angle as opposed to viewing the display from directly in front of the display. The inability to view the display from all locations is especially true of larger mailing machines, where the modules 36, 38 can extend for some distance up to several feet long. For example, an operator standing at the input end 14 of the mailing machine 10 will not be able to view the display device 22 on the UIC 18. Similarly, an operator located at the output end 16 may also not be able to view the display device 22 on the UIC 18. The problem is further compounded if there is a single operator that has to move between the input end 14 and output end 16 during operation of the machine, while checking status of the UIC 18, as indicated by the display device 22, to ensure proper operation of the mailing machine 10. If the operator is unable to clearly view the display device 22 during operation of the mailing machine 10, errors in the processing of the mail pieces can occur. In addition, the inability of the operator to know operating status of the mailing machine 10 during operation can lead to inefficiency in operation of the mailing machine 10, as well as decreased customer satisfaction with the mailing machine 10.

Thus, there exists a need for an improved mailing machine providing for increased operator efficiency.

SUMMARY OF THE INVENTION

The present invention alleviates the problems associated with the prior art and provides a mailing machine with a moveable control panel device to enable an operator to clearly view the control panel device regardless of the operator's position with respect to the mailing machine.

In accordance with the present invention, a mailing machine is provided with a control panel device that is capable of moving about a center axis thereby enabling the operator to turn the control panel device to reposition the control panel to face in different directions with respect to the mailing machine. The rotation of the control panel device allows an operator to clearly view a display on the device from any work area of the mailing machine. For example, if an operator is standing near an input end of the mailing machine, the control panel device can be rotated such that it can be viewed by the operator while standing near the input end of the mailing machine.

In accordance with an embodiment of the present invention, a turret on the top cover of the mailing machine is provided with a rotating portion. The rotating portion includes a docking station for the control panel device, including a connector to electronically couple the control panel device to the mailing machine. One or more guides are provided on the rotating portion to aid in the insertion of the control panel device. The control panel device can be secured in the docking station by a locking tab. The rotating portion is rotatable with respect to the cover of the mailing machine, thereby allowing the control panel device to be rotated such that an operator can view the device from either end of the mailing machine.

In accordance with another embodiment of the present invention, the top cover of the mailing machine is provided with an curved slot that extends along a portion of the length of the mailing machine. A docking station is slidably mounted in the slot. The docking station can slide along the slot such that the control panel device stays perpendicular to the curvature of the slot. Alternatively, the docking station could also rotate within the slot, thereby allowing the control panel device to be repositioned closer to either end of the mailing machine as well as rotating the control panel device to face towards either end of them mailing machine.

Therefore, it should now be apparent that the invention substantially achieves all the above aspects and advantages. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DESCRIPTION OF THE DRAWINGS

The accompanying drawings illustrate a presently preferred embodiment of the invention, and together with the general description given above and the detailed description given below, serve to explain the principles of the invention. As shown throughout the drawings, like reference numerals designate like or corresponding parts.

DETAILED DESCRIPTION OF THE PRESENT INVENTION

Figure 1:
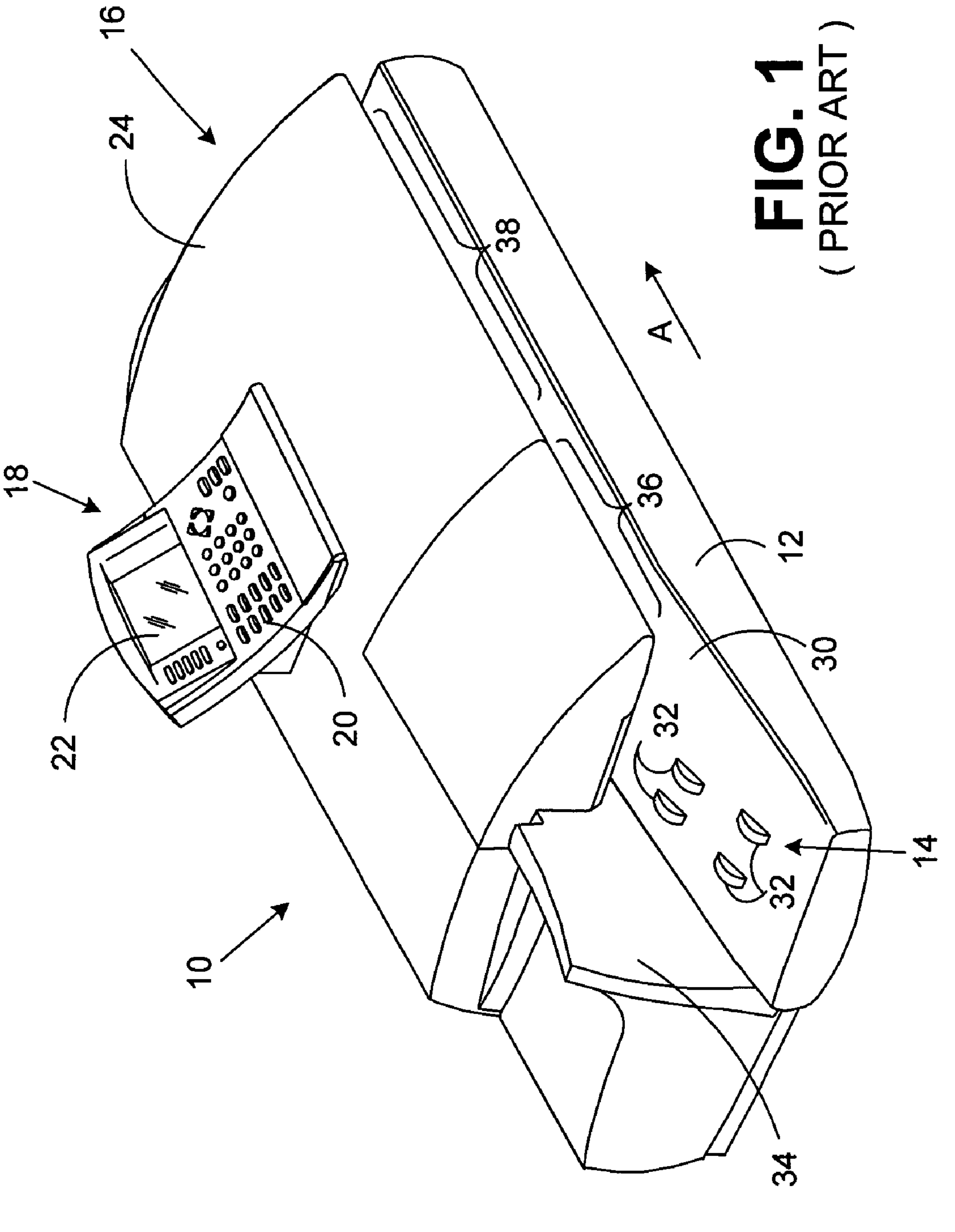
FIG. 1 (PRIOR ART)
FIG. 1 illustrates a conventional mailing machine found in the prior art.
Figure 2:
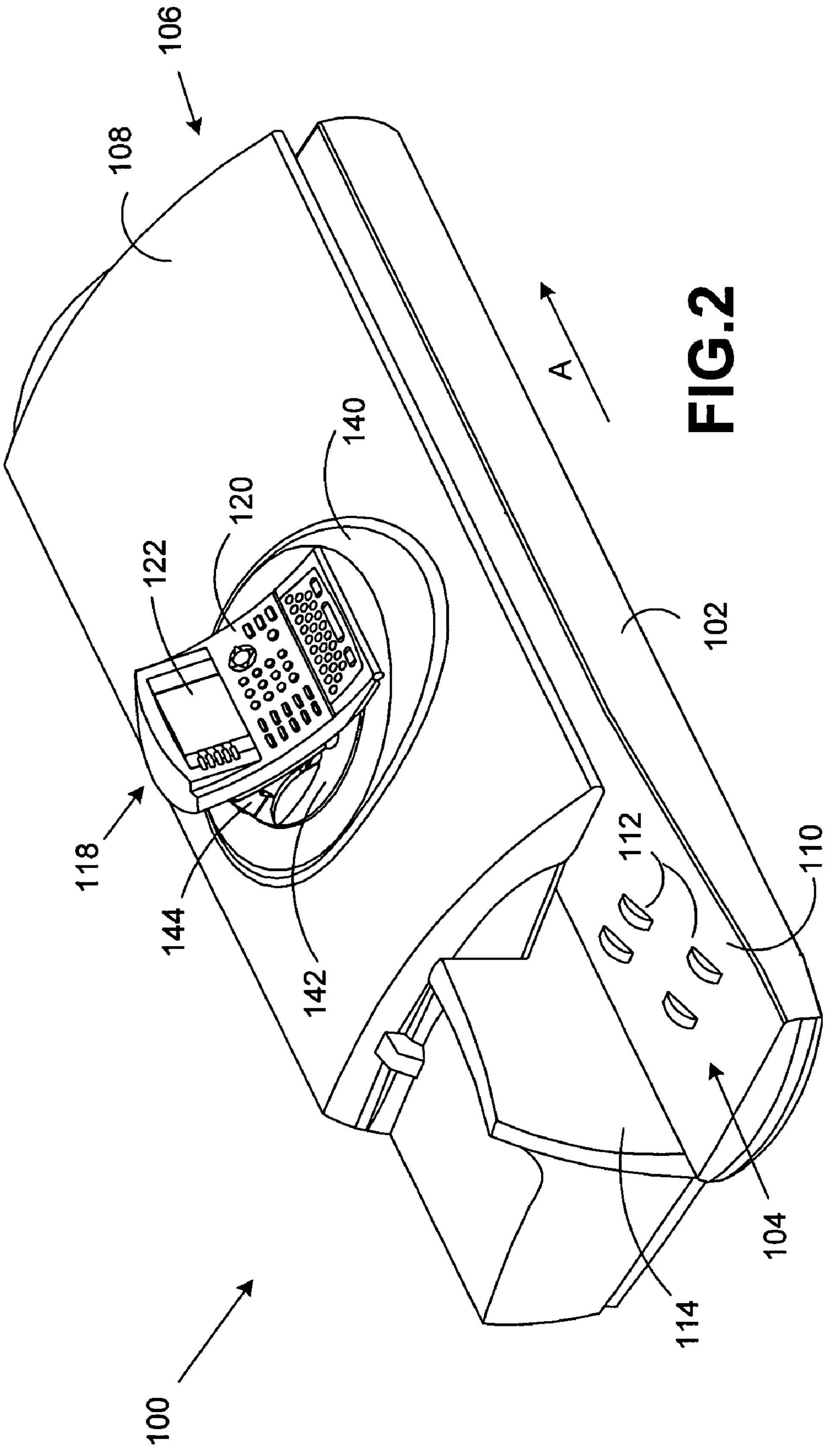
FIG. 2 illustrates a mailing machine having a repositionable control panel device in accordance with one embodiment of the present invention.

In describing the present invention, reference is made to the drawings, wherein there is seen in FIG. 2 a mailing machine 100 having a moveable user controller, such that the user controller can be repositioned in one of a plurality of positions, in accordance with an embodiment of the present invention. Mailing machine 100 comprises a base unit, designated generally by the reference numeral 102, the base unit 102 having a mail piece input end, designated generally by the reference numeral 104 and a mail piece output end, designated generally by the reference numeral 106. One or more cover members 108 are pivotally mounted on the base 102 so as to move from the closed position shown in FIG. 2 to an open position (not shown) so as to expose various operating components and parts for service and/or repair as needed.

Figure 3:
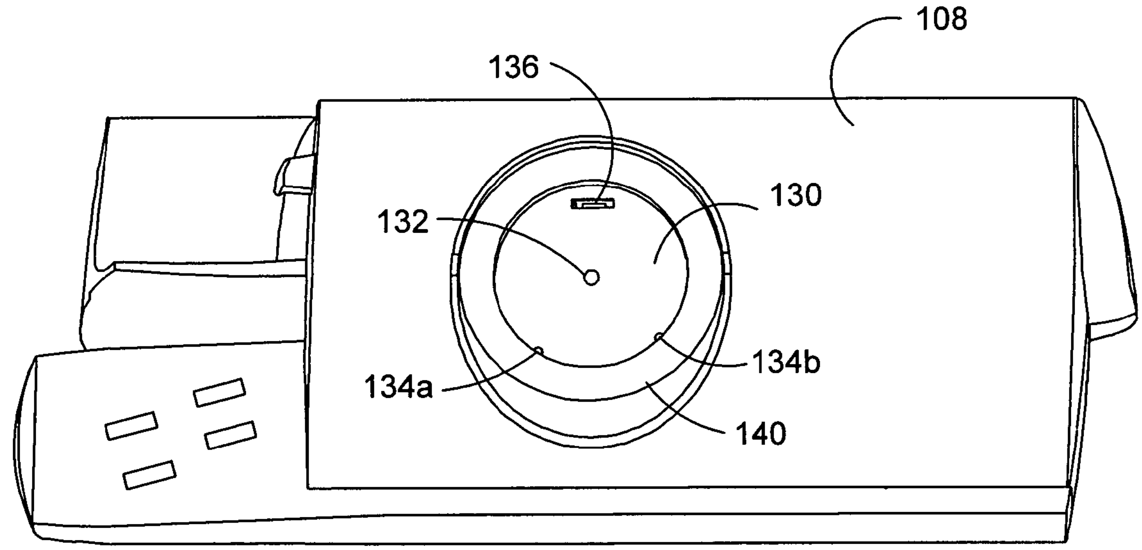
FIG. 3 illustrates a top view of the mailing machine illustrated in FIG. 2, without the rotating portion.

The base unit 102 further includes a horizontal feed deck 110 which extends substantially from the input end 104 to the output end 106. One or more nudger rollers 112 can be suitably mounted under the feed deck 110 and project upwardly through openings in the feed deck so that the periphery of the rollers 112 is slightly above the upper surface of the feed deck 110 and can exert a forward feeding force on a succession of mail pieces placed in the input end 104. A vertical wall 114 defines a mail piece stacking location from which the mail pieces are fed by the nudger rollers 112 along the feed deck 110 and into a transport system (not shown) that transports the mail pieces through the mailing machine 100. In accordance with the present invention, mailing machine 100 is provided with turret 140 on the top of the cover 108. FIG. 3 illustrates the turret 140 of the mailing machine 100. Turret 140 is preferably cylindrical in shape, and includes a recessed well 130 into which a rotating portion (described below) is situated. Well 130 can be recessed, for example, approximately 22 mm. The turret 140 is preferably integrally molded with the cover 108, such that when the cover 108 is moved to an open position, the turret 140 will move with the cover 108. Alternatively, the turret 140 could be separate from the cover 108 and protrude through an opening in the cover 108, such that when the cover 108 is moved to an open position, the turret 140 will remain in place. As another alternative, the cover 108 could be formed from multiple parts, with a seam located around the turret 140. Thus, each cover portion of the cover 108 could be individually opened with the turret 140 remaining in place.

The well 130 includes a mounting hole 132 for use in securing the rotating portion (described below) to the turret 140. An opening 136 is provided to allow wires and/or cables from the mailing machine 100 to enter the well 130 for connection to the user controller 118 (described further below). A pair of tabs 134*a*, 134*b* are provided on the rim of the well 130. Tabs 134*a*, 134*b* extend into the well 130 to provide physical stops for the rotation of the rotating portion as further described below. The tabs 134*a*, 134*b* are spaced to allow for rotation of the rotating portion by a predetermined amount. As illustrated in FIG. 3, for example, the tabs 134*a*, 134*b* are spaced to allow for a total of 105 degrees of rotation. It should be understood, of course, that any degree of rotation could be provided.

Referring again to FIG. 2, a rotating portion 142, provided with a docking station 144 for a control panel device, also referred to as a user controller or user controller interface (UIC) 118, is provided within the well 130 of turret 140. The user controller 118 performs user interface and control functions for the mailing machine 100. Specifically, the user controller 118 provides all user interfaces, executes control of the mailing machine 100 and print operations, calculates postage for debit based upon rate tables, provides the conduit for the Postal Security Device (PSD) to transfer postage indicia to the printer (not shown) within the mailing machine 100, operates with peripherals for accounting, printing and weighing, and conducts communications with a data center for postage funds refill, software download, rates download, and market-oriented data capture. The user controller 118, in conjunction with an embedded PSD, constitutes the system meter that satisfies U.S. information-based indicia postage (IBIP) meter requirements and other international postal regulations regarding closed system meters. The user controller 118 may contain one or more input/output devices, such as, for example, a keyboard 120 and a display device 122.

Figure 4:
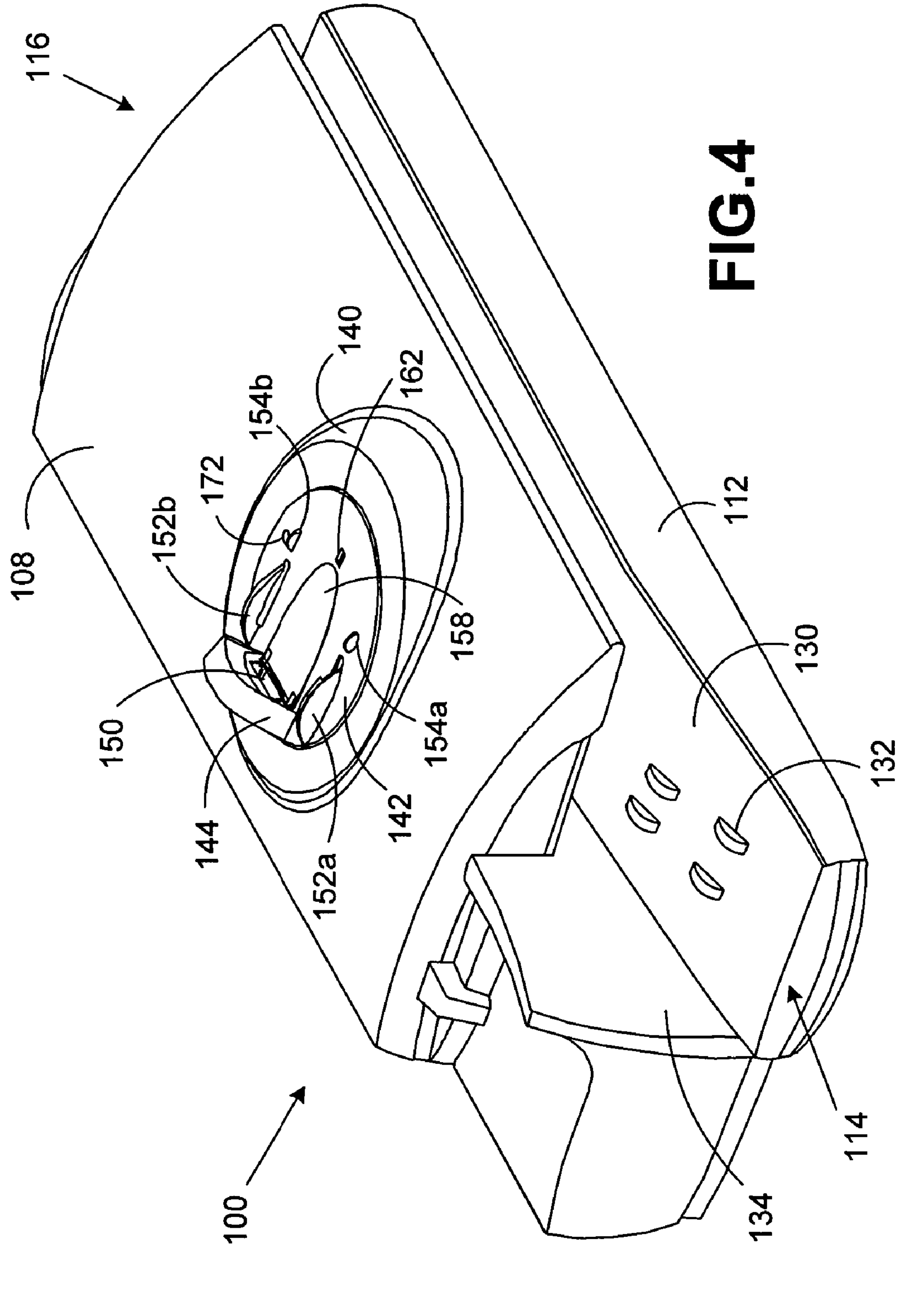
FIG. 4 illustrates the mailing machine of FIG. 2, including the rotating portion, without the control panel device mounted thereon.
Figure 5:
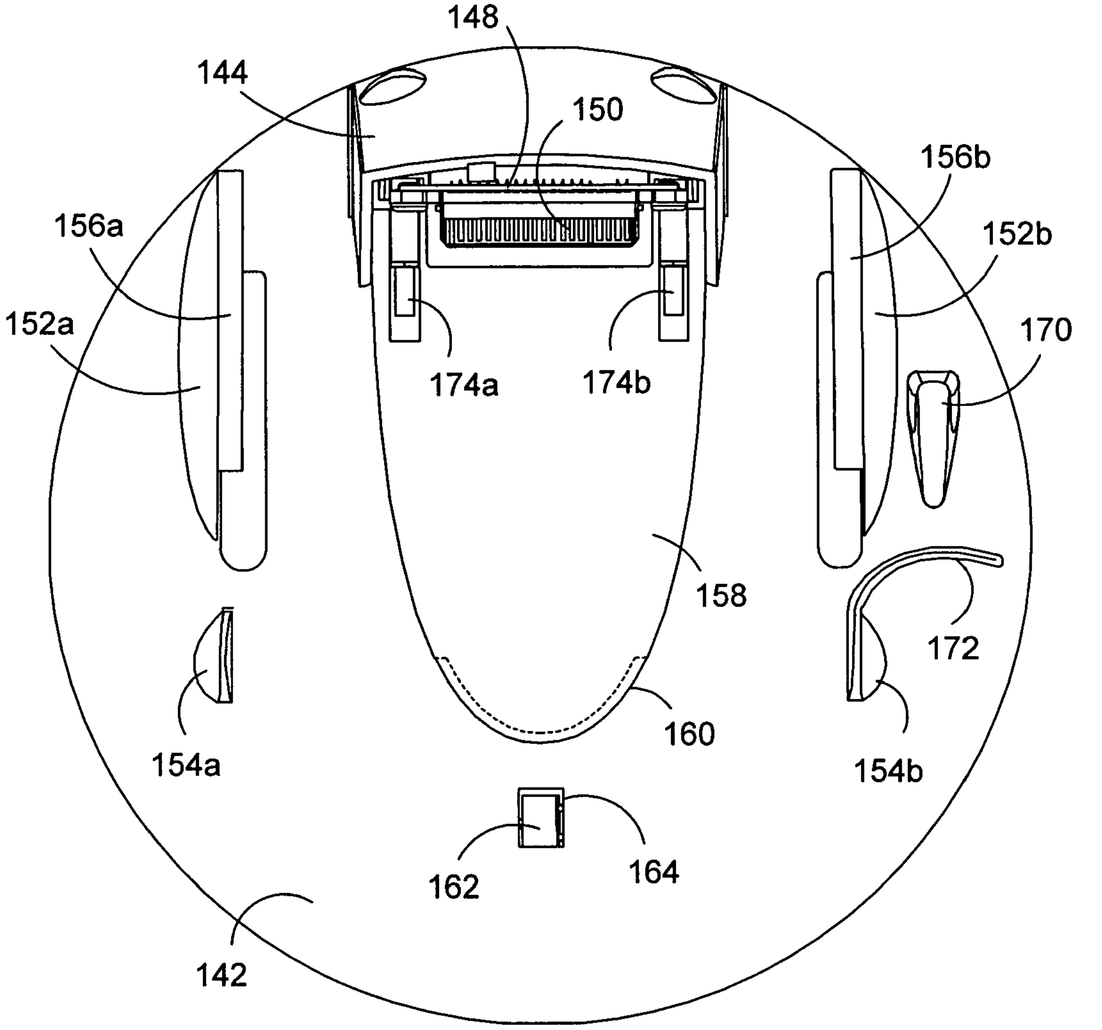
FIG. 5 illustrates a top view of the rotating portion of FIG. 4.
Figure 7:
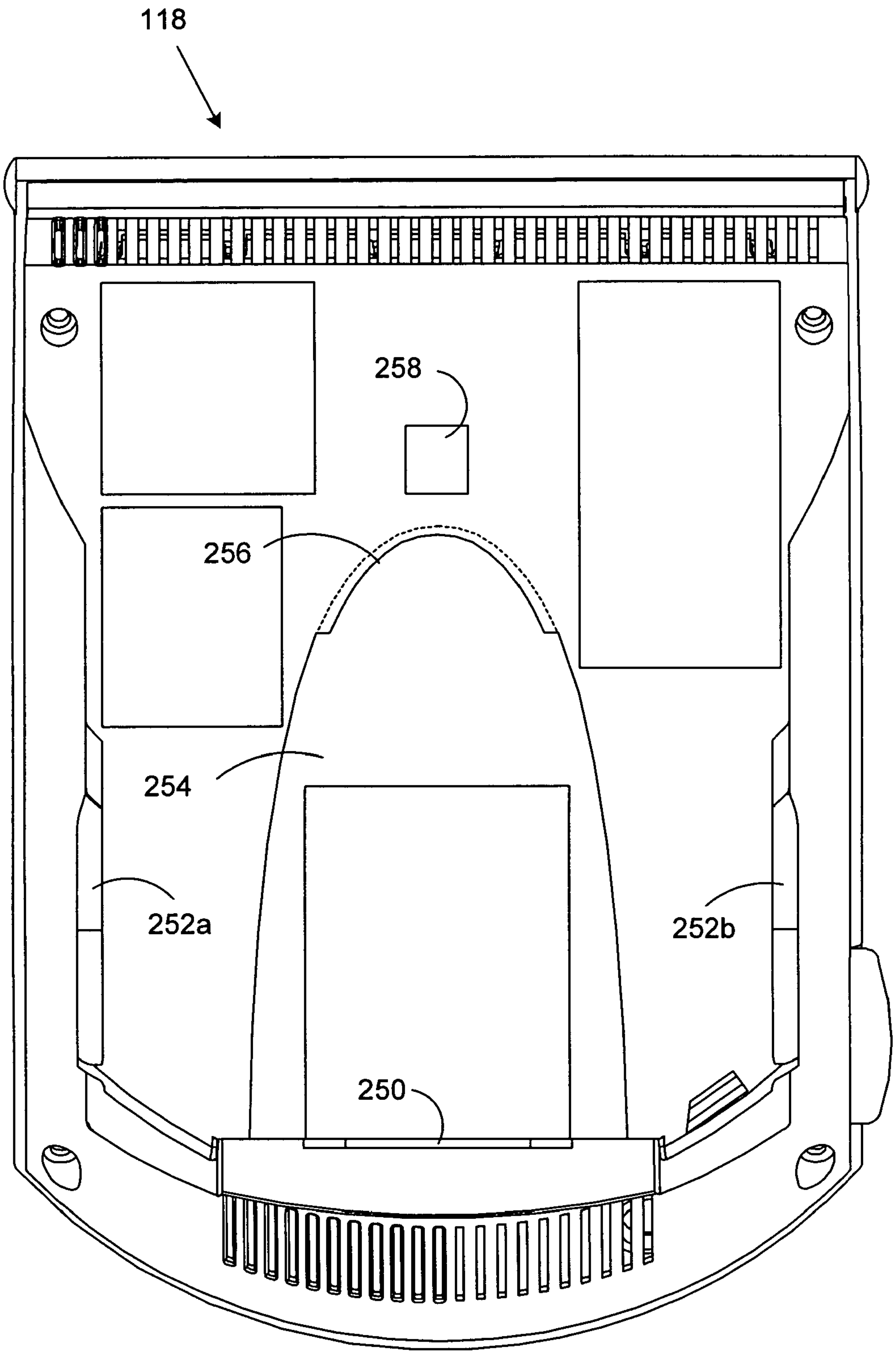
FIG. 7 illustrates a bottom view of a control panel device according to an embodiment of the present invention.

Referring now to FIGS. 4 and 5, there is illustrated the mailing machine 100 of the present invention without the control panel device 118 mounted thereon, and a top view of the rotating portion 142, respectively. Docking station 144 is provided with a connector 150 to mate with a corresponding connector 250 (FIG. 7) of the user controller 118. Connector 150 may be mounted to a printed circuit board 148. The rotating portion 142 is preferably provided with one or more cams, such as, for example, cams 152*a*, 152*b*, to aid alignment during mating of the user controller 118 with the docking station 144. Cams 152*a*, 152*b* are preferably integrally molded with the rotating portion 142. The cams 152*a*, 152*b* each include a guiding portion 156*a*, 156*b* to guide a corresponding cam follower 252*a*, 252*b* (FIG. 7) of the user controller 118. The guiding portions 156*a*, 156*b* are preferably inclined from the back to the front. Thus, as the cam followers 252*a*, 252*b* make contact with the guiding portions 156*a*, 156*b*, the user controller 118 is forced downward as it is pushed back toward the docking station 144. Thus, the angle at which the user controller 118 can be inserted into the docking station 144 is limited by the cams 152*a*, 152*b*, thereby ensuring that the corresponding connectors 150, 250 are properly aligned for insertion. Proper alignment of the connectors 150, 250 reduces the stress applied to the pins of the connectors 150, 250, thereby preventing any damage to the connectors 150, 250.

The rotating portion 142 further preferably includes one or more guides, such as, for example, guides 154*a*, 154*b*, to further aid in alignment of the user controller 118 during insertion. The guides 154*a*, 154*b* are preferably integrally molded with the rotating portion 142. In addition, the rotating portion 142 is preferably provided with a raised tongue 158 to aid in alignment and securing of the user controller 118 to the rotating portion 142. The raised tongue 158 is preferably raised above the surface of the rotating portion 142 by approximately 4 mm. A corresponding tongue groove 254 (FIG. 7) is provided on the bottom of the user controller 118 to mate with the tongue 158. Tongue 158 preferably includes a lip 160 that slides into a channel portion 256 of the groove 254, thereby aiding in securing the user controller 118 to the rotating portion 142. A locking tab 162 can be provided to secure the user controller 118. The locking tab 162 is preferably a tab that passes through an opening 164 in the rotating portion 142 to project into a corresponding opening 258 (FIG. 7) in the bottom of the user controller 118 when the user controller 118 is fully inserted into the docking station 144. A release mechanism 170 is provided to release the locking tab 162 for removal of the user controller 118. A tail portion 172 of the guide 154*b* acts as a finger support such that an operator can grasp the release mechanism 170 and tail portion 172 of guide 154*b* between a thumb and forefinger to pull the release mechanism 170 toward the tail portion 172 of guide 154*b*. Movement of the release mechanism 170 will cause the locking tab 162 to descend into the opening 164, further described below with respect to FIG. 6, thereby releasing the user controller 118.

The docking station 144 of rotating portion 142 is preferably provided with one or more devices to aid in the insertion/extraction of the user controller 118, such as, for example, compression cylinders 174*a*, 174*b*. The compression cylinders each include a compression spring. As the user controller 118 is moved toward the docking station 144, it will contact the compression cylinders 174*a*, 174*b*, thereby causing the compression springs to compress and provide a slight resistance against the user controller 118. When the opening 258 in the bottom of the user controller 118 is above the locking clip 162, the locking clip 162 will extend into the opening 258 and the force of the compression springs will help to maintain the user controller 118 securely in place. When the release mechanism 170 is operated as described above, the compression springs will cause the user controller 118 to separate from the docking station 144, thereby aiding in extraction of the user controller 118 from the docking station 144.

Figure 6:
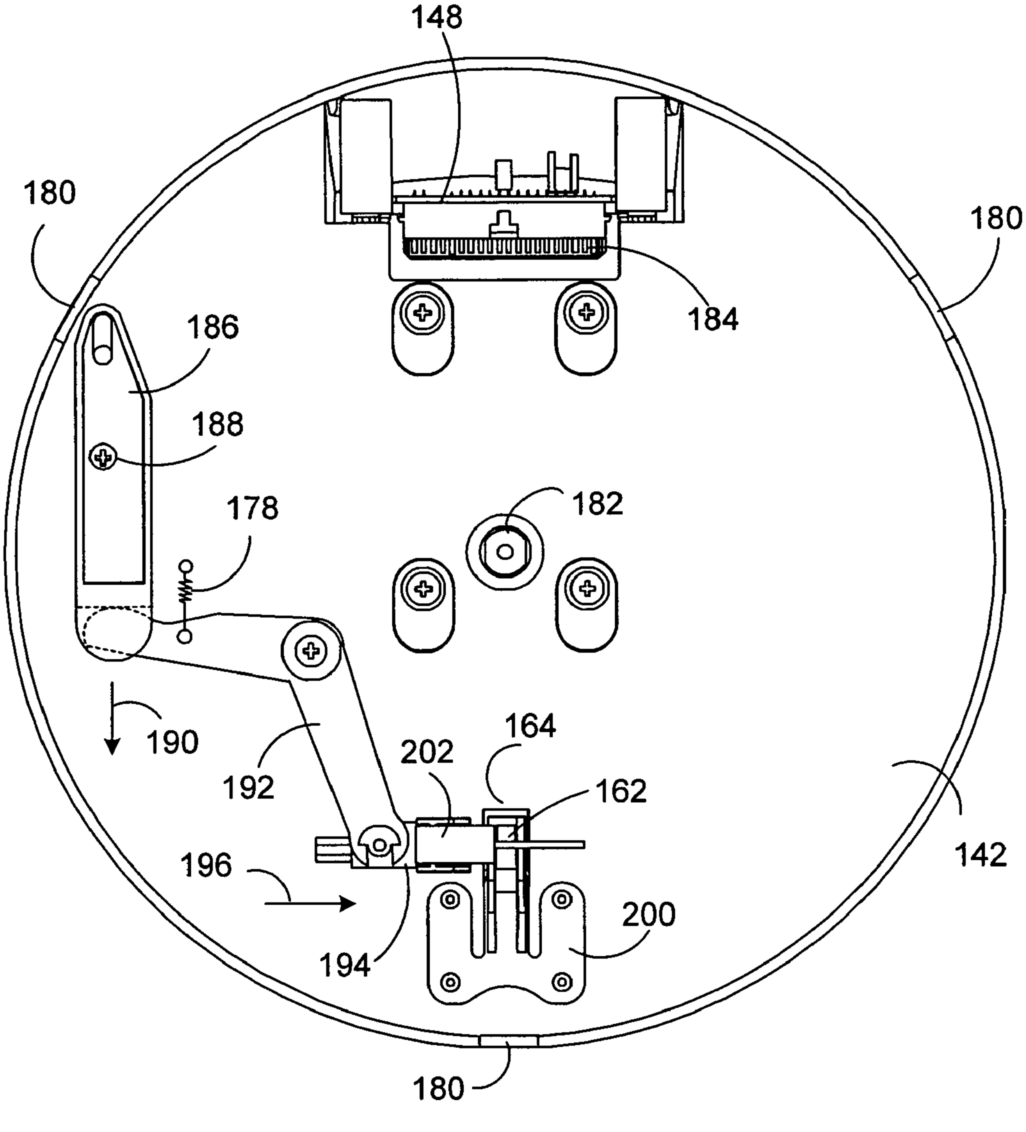
FIG. 6 illustrates a bottom view of the rotating portion of FIG. 4.

Referring now to FIG. 6, there is illustrated a bottom view of the rotating portion 142. A plurality of downwardly extending tabs 180 are provided on the bottom of the rotating portion 142. As illustrated in FIG. 6, three tabs 180 are provided spaced at equal intervals around the perimeter of the rotating portion 142. It should be understood, of course, that more than three tabs 180 could be provided if desired. The tabs 180 contact the top surface of the well 130 when the rotating portion 142 is inserted into the well. A shaft 182 extends downward into the mounting hole 132 of the turret 140. The end of the shaft 182 can be secured beneath the mounting hole 132 with a mounting bracket/screw combination (not shown) such that the rotating portion 142 can not be removed from the well 130. The rotating portion 142 will then rotate within the well 130, riding on the tabs 180. Rotation of the rotating portion 142 is controlled by one or more of the tabs 180 contacting the tabs 134*a*, 134*b* in the well 130. Thus, by controlling the location of the tabs 134*a*, 134*b* and the tabs 180, movement of the rotating portion can be limited to any desired amount.

A connector 184 is mounted to printed circuit board 148. Connector 184 allows for connection of any wires/cables, such as, for example, a ribbon cable, from the mailing machine 100 that enter into the well 130 through the opening 136. The printed circuit board 148 couples the connector 184 to the connector 150, thereby electrically coupling the user controller 118 to the mailing machine 100.

Release mechanism 170 is secured to a link 186 via a screw 188. Thus, when the release mechanism 170 is moved by an operator, the link 186 will also move in a direction indicated by arrow 190. A spring 178 provides a biasing force to maintain the link 186 (and thus the release mechanism 170) in a home position. Movement of the link 186 will cause the elbow link 192 to rotate counter clockwise, thereby forcing the link 194 to move in a direction indicated by arrow 196. The locking clip 162 is secured to the underside of the rotating portion 142 by a mounting bracket 200 such that the mounting clip 162 extends through the opening 164 above the rotating portion 142. A finger portion 202 is secured to the bottom of the mounting clip 162 and extends over the link 194. Mounting clip 162, mounting bracket 200 and finger portion 202 are preferably a single molded piece. The finger portion 202 has a wedge shape, with the thin end facing toward the link 194. As the link 194 is moved in the direction of arrow 196, it will contact the finger portion 202 and slide between the finger portion 202 and the underside of the rotating portion 142, thereby pushing the finger portion 202 away from the underside of the rotating portion 142. As the finger portion 202 is pushed away from the underside of the rotating portion 142, the locking clip 162 will be pulled through the opening 164 and beneath the rotating portion 142, thereby releasing the user controller 118.

It should be noted that the movement of the user controller 118 need not be limited to only a single plane. For example, the shaft 182 could be provided with a sphere on its end to rest in the opening 132 in the well 130 of the turret. The rotating portion 142 could then rotate around in the well 130 as well as tilt back and forth or side to side based on the movement of the sphere within the opening 132.

Figure 8:
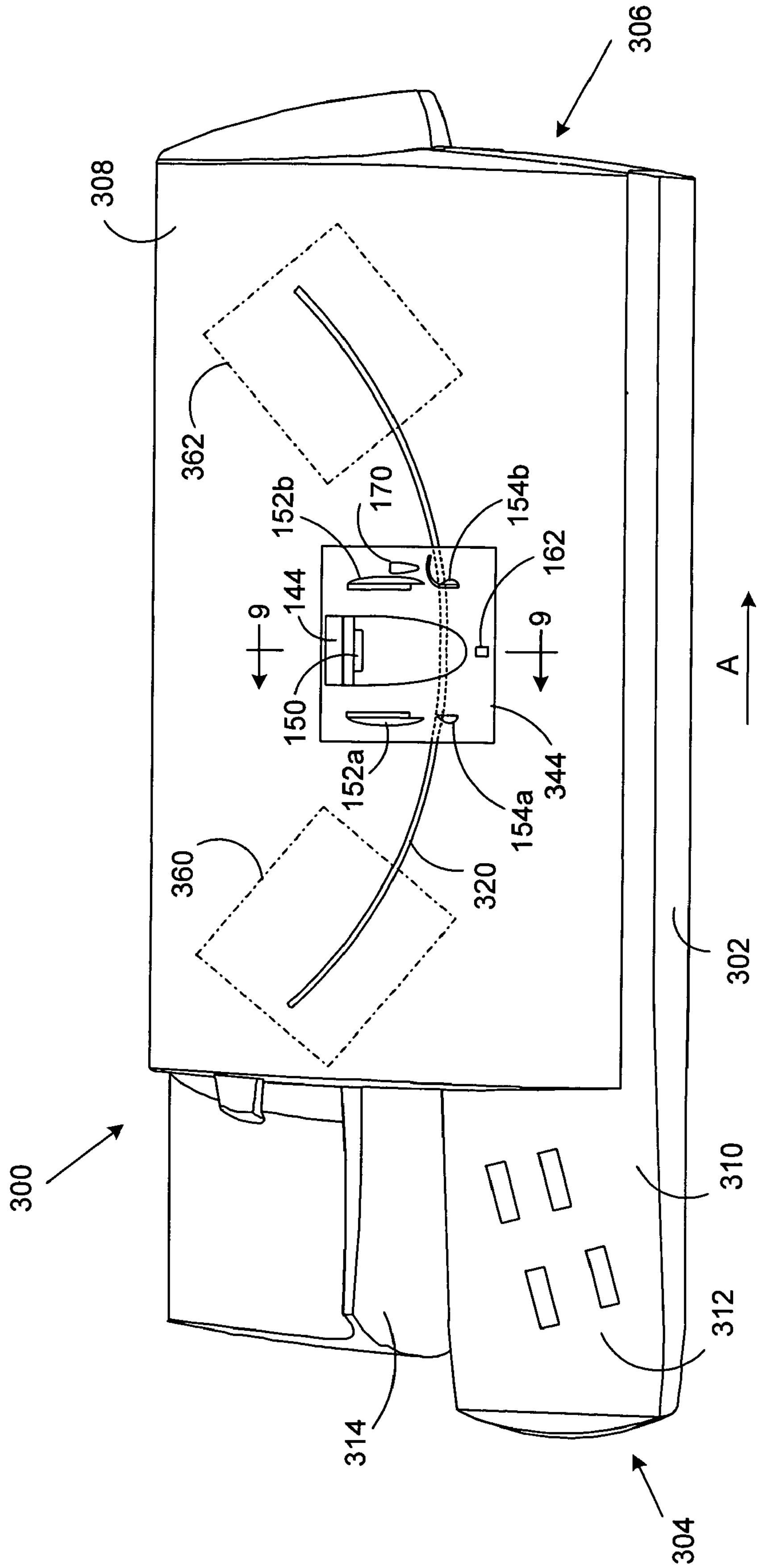
FIG. 8 illustrates a mailing machine having a repositionable control panel device in accordance with another embodiment of the present invention.

FIG. 8 illustrates a top view of a mailing machine 300 having a repositionable user controller in accordance with another embodiment of the present invention. Mailing machine 300 comprises a base unit, designated generally by the reference numeral 302, the base unit 302 having a mail piece input end, designated generally by the reference numeral 304 and a mail piece output end, designated generally by the reference numeral 306. One or more cover members 308 are pivotally mounted on the base 302 so as to move from the closed position shown in FIG. 8 to an open position (not shown) so as to expose various operating components and parts for service and/or repair as needed.

The base unit 302 further includes a horizontal feed deck 310 which extends substantially from the input end 304 to the output end 306. One or more nudger rollers 312 can be suitably mounted under the feed deck 310 and project upwardly through openings in the feed deck so that the periphery of the rollers 312 is slightly above the upper surface of the feed deck 310 and can exert a forward feeding force on a succession of mail pieces placed in the input end 304. A vertical wall 314 defines a mail piece stacking location from which the mail pieces are fed by the nudger rollers 312 along the feed deck 310 and into a transport system (not shown) that transports the mail pieces through the mailing machine 300 in the direction of arrow A. In accordance with the present invention, the cover 308 of mailing machine 300 is provided with a slot 320 that extends along a portion of the cover 308. The slot 308 can be an arc or substantially linear with curved ends. Preferably, there is at least a portion of the slot 320 that is located substantially near the middle of the cover 308 (from end to end) that is substantially parallel to the path of travel as indicated by the arrow A.

Figure 9:
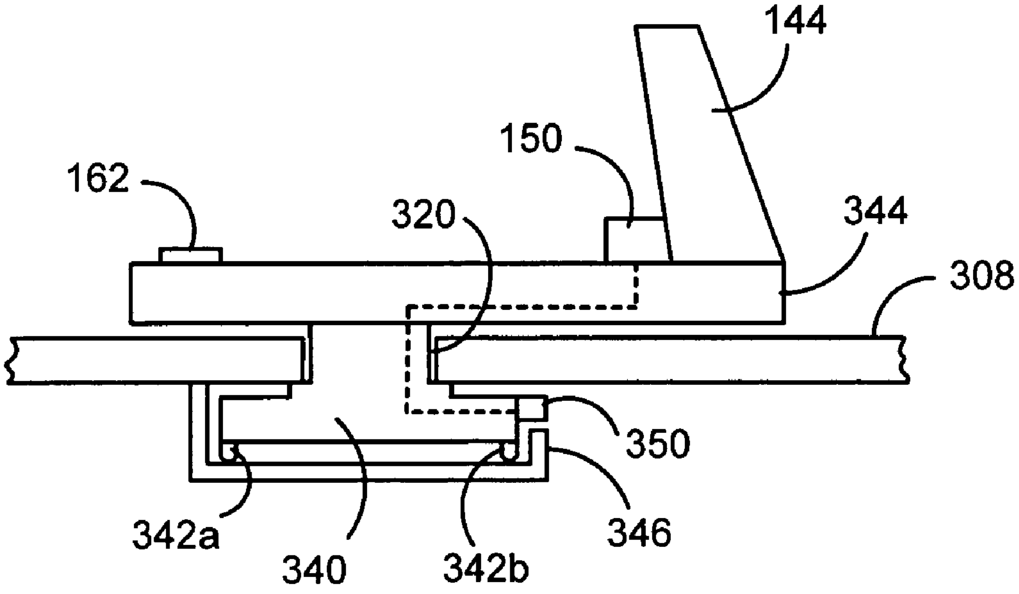
FIG. 9 illustrates a cross-sectional view of a portion of the mailing machine of FIG. 8.

An interface board 344 for a mounting a control panel device (not shown), also referred to as a user controller or user controller interface (UIC), is slidably mounted within the slot 320. The interface board 344 could be provided with components similar to the rotating portion 142 described with respect to FIGS. 4 and 5, including, for example, a docking station 144 with connector 150, cams 152*a*, 152*b*, guides 154*a*, 154*b*, a release mechanism 170 and a locking tab 162. Thus, a user controller can be inserted onto and extracted from the interface board 344 in a similar manner as previously described with respect to the rotating portion 142. FIG. 9 illustrates a cross-sectional view, taken along line 9-9' of FIG. 8, of the mounting of the interface board 344 with the slot 320 according to an embodiment of the present invention. A bracket 340 is secured to the bottom of the interface board 344. Bracket 340 is preferably T-shaped, with the stem portion passing through the slot 320. The bottom of the bracket 340 can be provided with one or more tabs 342*a*, 342*b*. The mounting bracket 340 rests in a channel rail 346 on the tabs 342*a*, 342*b*. The channel rail 346 runs parallel to the slot 320 along the length of the slot 320 beneath the surface of the cover 308. Channel rail 346 could be integral with or secured to the cover 308, or secured to internal mounting brackets (not shown) within the mailing machine 300. The mounting bracket 340 can slide along the channel rail 346, riding on the tabs 342*a*, 342*b*. It should be understood, of course, that the tabs 342*a*, 342*b* could be replaced by bearings, rollers or any other suitable mechanism. A connector 350 can be provided on the mounting bracket 340 which allows for connection of any wires/cables from the mailing machine 300. Connector 350 is coupled to connector 150 via internal wiring, indicated by the dotted line 352, thereby allowing a user controller to be electrically coupled to the mailing machine 300.

Referring again to FIG. 8, the interface board 344 can be moved along the slot 320 (by riding in the channel rail 346) to any position desired by an operator along the slot 320. For example, the interface board 344 could be positioned in the middle of the slot 320 (as illustrated in FIG. 8) such that a user controller mounted to the interface board will face substantially perpendicular to the path of travel indicated by arrow A. The interface board 344 could be repositioned such that it is closer to the input end 304, as indicated by the dashed line 360, by sliding the interface board 344 closer to the input end 304. Because of the curve of the slot 320, the face of the user controller will be rotated toward the input end 304 as well. The interface board 344 could be repositioned such that it is closer to the output end 306, as indicated by the dashed line 362, by sliding the interface board 344 closer to the output end 306. Because of the curve of the slot 320, the face of the user controller will be rotated toward the output end 306 as well. Thus, not only is the field of view rotated toward the operator, but it is also moved closer to the operator, thereby allowing the operator to more easily see the user controller.

It should be noted that the interface board 344 could also be rotatably mounted to the bracket 340, thereby allowing the interface board 344 to rotate with respect to the bracket 340. In this manner, a user controller mounted to the interface board 344 could be rotated to face any direction regardless of the position along the slot 320.

Thus, according to the present invention, a mailing machine is provided with a removable control panel device that is capable of being repositioned thereby enabling an operator to position the control panel device to face in different directions with respect to the mailing machine. The repositioning of the control panel device allows an operator to clearly view a display on the device from any work area of the mailing machine. Those skilled in the art will also recognize that various modifications can be made without departing from the spirit of the present invention. For example, a user controller could be secured in place on the rotating portion 142 or interface board 344 by a simple spring clip that snaps into place when the user controller is fully seated and can be released by pushing down on the clip.

While preferred embodiments of the invention have been described and illustrated above, it should be understood that they are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A mailing machine comprising:

a base unit;

a cover secured to the base unit;

a well formed in the cover, the well including at least one stop device provided on a rim of the well and extending into the well;

a rotating portion disposed in the well, the rotating portion including a plurality of tabs around a perimeter of the rotating portion that extend from the rotating portion, the tabs contacting a top surface of the well, the rotating portion being supported in the well by the tabs, at least one tab contacting the at least one stop device in the well to restrict rotation of the rotating portion within the well; and a docking station secured to the rotating portion, the docking station adapted to secure a user controller and couple the user controller to the mailing machine, the rotating portion being rotatable within the well to reposition the docking station with respect to the cover such that the user controller secured to the docking station can be positioned in a plurality of different positions with respect to the mailing machine.

2. The mailing machine of claim 1, wherein the well is integrally molded with the cover.

3. The mailing machine of claim 1, wherein the docking station further comprises:

a first connector to mate with corresponding connector of the user controller; and a second connector coupled to the first connector, the second connector to mate with a cable from the mailing machine.

4. The mailing machine of claim 3, wherein the rotating portion further comprises:

at least one cam for guiding the user controller during insertion of the user controller into the docking station.

5. The mailing machine of claim 4, wherein the at least one cam includes an inclined guiding portion, the inclined portion contacting a portion of the user controller to force the user controller downward as it is being inserted into the docking station.

6. The mailing machine of claim 4, wherein the at least one cam is integrally molded with the rotating portion.

7. The mailing machine of claim 4, wherein the rotating portion further comprises:

a tongue portion having a lip, the tongue portion mating with a corresponding groove in the user controller, the lip mating with a corresponding channel in the groove.

8. The mailing machine of claim 3, wherein the rotating portion further comprises:

a locking tab passing through an opening in the rotating portion, the locking tab projecting into a corresponding opening in the user controller when the user controller is inserted into the docking station to secure the user controller.

9. The mailing machine of claim 8, wherein the rotating portion further comprises:

a release mechanism coupled to the locking tab, the release mechanism when activated causing the locking tab to descend through the opening in the rotating portion thereby releasing the user controller secured to the docking station.

10. The mailing machine of claim 1, wherein the docking station is rotatable in a first plane and pivotable in a second plane.

11. A mailing machine comprising:

a cover;

a slot in the cover extending along a portion of the cover; and an interface board adapted to slide within in the slot, the interface board including a docking station for mounting a user controller, wherein the user controller inserted into the docking station can be moved by sliding the interface board within the slot to position the user controller in a plurality of different positions with respect to the mailing machine.

12. The mailing machine of claim 11, wherein the docking station includes a connector to mate with a corresponding connector on the user controller, and the interface board includes a pair of cams to guide the user controller being inserted into the docking station by pushing down on the user controller to align the connector on the docking station with the corresponding connector on the user controller.

13. The mailing machine of claim 11, wherein the slot includes at least one curved portion.

14. The mailing machine of claim 13, wherein when the user controller is positioned within the curved portion of the slot, a face of the user controller will be rotated with respect to the mailing machine.

15. The mailing machine of claim 11, wherein the interface board can be rotated as well as slid within the slot.

16. The mailing machine of claim 13, wherein the slot extends substantially from a first end of the cover located near an input end of the mailing machine to a second end of the cover located near an output end of the mailing machine, and the at least one curved portion includes a curved portion near each end of the slot.

17. The mailing machine of claim 11, further comprising:

a bracket securing the interface board within the slot, and a channel secured beneath the cover, the channel adapted to receive the bracket, the bracket sliding along the channel to move the docking station along the slot.

* * * * *